(12) United States Patent
Koyata et al.

(10) Patent No.: US 8,066,896 B2
(45) Date of Patent: Nov. 29, 2011

(54) APPARATUS FOR ETCHING WAFER BY SINGLE-WAFER PROCESS AND SINGLE WAFER TYPE METHOD FOR ETCHING WAFER

(75) Inventors: Sakae Koyata, Tokyo (JP); Tomohiro Hashii, Tokyo (JP); Katsuhiko Murayama, Tokyo (JP); Kazushige Takaishi, Tokyo (JP); Takeo Katoh, Tokyo (JP)

(73) Assignee: Sumco Corporation (JP)

( * ) Notice: Subject to any disclaimer, the term of this patent is extended or adjusted under 35 U.S.C. 154(b) by 998 days.

(21) Appl. No.: 11/893,538

(22) Filed: Aug. 15, 2007

(65) Prior Publication Data

US 2007/0298614 A1 Dec. 27, 2007

Related U.S. Application Data

(62) Division of application No. 11/582,880, filed on Oct. 17, 2006, now Pat. No. 7,488,400.

(30) Foreign Application Priority Data

Oct. 18, 2005 (JP) ................................. 2005-302538

(51) Int. Cl.
*B44C 1/22* (2006.01)
(52) U.S. Cl. ........................................... 216/83; 216/92
(58) Field of Classification Search .................. None
See application file for complete search history.

(56) References Cited

U.S. PATENT DOCUMENTS

| 4,968,375 | A | 11/1990 | Sato et al. |
| 5,688,322 | A | 11/1997 | Motoda et al. |
| 6,159,288 | A | 12/2000 | Satou et al. |
| 6,444,589 | B1 * | 9/2002 | Yoneya et al. ................ 438/745 |
| 6,579,382 | B2 * | 6/2003 | Ito ................... 134/33 |
| 6,861,359 | B2 * | 3/2005 | Ota et al. ...................... 438/692 |
| 7,252,778 | B2 * | 8/2007 | Iwamoto et al. ................ 216/84 |
| 2003/0073309 | A1 * | 4/2003 | Emami ......................... 438/689 |
| 2009/0117749 | A1 * | 5/2009 | Koyata et al. .................. 438/753 |
| 2009/0181546 | A1 * | 7/2009 | Katoh et al. .................. 438/745 |
| 2009/0186488 | A1 * | 7/2009 | Takeo et al. ................... 438/748 |

FOREIGN PATENT DOCUMENTS

JP  11-289002  10/1999

OTHER PUBLICATIONS

European Search Report from corresponding European Application No. EP06021737, dated Dec. 11, 2008.

* cited by examiner

*Primary Examiner* — Anita Alanko
(74) *Attorney, Agent, or Firm* — Kolisch Hartwell, P.C.

(57) ABSTRACT

An apparatus for etching a wafer by a single-wafer process comprises a fluid supplying device which feeds an etching fluid on a wafer, and a wafer-chuck for horizontally holding the wafer. The wafer-chuck is equipped with a gas injection device for injecting a gas to the wafer, a first fluid-aspirating device, and a second fluid-aspirating device. The etching fluid supplied on the wafer is spread by a rotation of the wafer. The etching fluid is scattered by a centrifugal force, or flows down over an edge portion of the wafer and is blown-off by the gas injected from the gas injection unit, and is aspirated by the first fluid-aspirating device or the second fluid-aspirating device.

4 Claims, 3 Drawing Sheets

APPARATUS FOR ETCHING WAFER BY SINGLE-WAFER PROCESS AND SINGLE WAFER TYPE METHOD FOR ETCHING WAFER

CROSS-REFERENCE TO RELATED APPLICATION

This application is a divisional of U.S. patent application Ser. No. 11/582,880, which was filed on Oct. 17, 2006, now U.S. Pat. No. 7,488,400, and which claims priority from Japanese Patent Application No. 2005-302538, which was filed Oct. 18, 2005. The complete disclosures of the above-identified patent applications are hereby incorporated by reference for all purposes.

BACKGROUND OF THE INVENTION

1. Field of the Invention

The invention relates to an apparatus for etching a wafer while horizontally holding a single wafer and rotating the wafer.

2. Description of Related Art

Generally, a manufacturing process of semiconductor wafers comprises: slicing a wafer from a single crystal ingot; facing and mechanically grinding (lapping) the wafer; etching the wafer; mirror polishing (polishing) the wafer; and cleaning the wafer. Through such steps, wafers having highly flat surfaces are manufactured. During the manufacturing process, a wafer is subjected to various mechanical workings such as cutting a block from the ingot, grinding the outside cylindrical surface of the block, slicing the wafer from the block, and lapping the wafer. As a result, the upper side of the wafer includes a damaged-layer as a work-affected layer. During the manufacturing process of semiconductor devices, the damaged layer of the wafer induces crystal defects such as slip dislocations to occur, and thereby deteriorating the mechanical strength of the wafer and causing adverse effects on the electrical property of the wafer. Therefore the damaged layer needs to be removed completely. In order to remove the damaged layer from the wafer, the wafer is subjected to etching treatment. Currently, immersion etching and etching by a single-wafer process are applied as the etching treatment.

Since the above-described etching by a single-wafer process is capable of controlling the surface roughness of a large-sized wafer, and the texture-size of the wafer, it is regarded as an optimal method for etching a wafer and has been subjected to examination. The etching by a single-wafer process is a method for etching a wafer by dropping an etching fluid on the upper surface of a flattened single wafer, horizontally rotating (spinning) the wafer so as to spread the dropped etching fluid over the whole area of the upper surface of the wafer, and etching the wafer. The etching fluid supplied to the upper surface of the wafer is applied with centrifugal force caused by rotation of the wafer in the horizontal plane, and the etching fluid is spread all over the wafer surface from a portion to which the etching fluid is supplied to the edge of the wafer. Therefore, the upper surface and the edge of the wafer are etched simultaneously. Most of the etching fluid supplied to the wafer is scattered from the wafer by centrifugal force and is recovered in a cup or the like provided in the etching apparatus. However, a certain amount of the etching fluid passes round the wafer edge to the undersurface of the wafer, and etches the edge portion and undersurface of the wafer.

In order to avoid the etching of the edge portion and undersurface of the wafer, Patent Document 1 (Japanese Unexamined Patent Application, First Publication No. H11-289002: see claims 1, 2, paragraphs [0010], [0018], [0019] and [0021]) discloses a single-wafer processing apparatus. In that apparatus, a center axis of a rotation base is connected to a rotation driver; a positioning portion for mounting a wafer on a predetermined position is provided at the peripheral portion of the rotation base; a support member for supporting the circumference of the wafer is disposed between the positioning portions at the periphery of the rotation base; and a treatment nozzle for supplying the etching fluid is disposed at the position above the rotation base. In such a single-wafer processing apparatus, the relative height X of the positioning portion and the support base compared with the undersurface of the wafer making contact with the rotation base is within a range of $0<X<(A+0.5)$, where A mm is the thickness of the peripheral portion of the wafer. In addition, in the above-described processing apparatus, a block for a gas supply is disposed around the central axis beneath the rotation base, and gas supply unit is disposed penetrating the interior of the rotation base. The gas from the block is supplied through the gas supply unit.

In such configurations of a single-wafer processing apparatus, by controlling the projecting height of the positioning portion and support member so as to satisfy the above-described range of relative height, it is possible to suppress the generation of turbulence and rebound of the etching fluid. In addition, by supplying a gas from the supply unit disposed at the block, it is possible to increase the atmospheric pressure in the space between the rotation base and the undersurface of the wafer, thereby preventing the etching fluid from passing round to the undersurface of the wafer.

In the conventional single-wafer type processing apparatus exemplified by the above-described apparatus of Patent Document 1, by supplying the gas to the space below the wafer, the etching fluid is prevented from passing round to the undersurface of the wafer. However, there is a possibility that the etching fluid stays for a long duration at the peripheral portion of the wafer causing undesirable etching of the edge portion subjected to the staying etching fluid. In such a case, the chamfered shape of the periphery of the wafer is deformed by the etching, and the edge of the wafer is etched heterogeneously.

In addition, in the conventional single-wafer type processing apparatus described in the above-described Patent Document 1, there is a possibility that the gas supplied to the space below the wafer scatters the etching fluid. The scattered etching fluid may be rebound by the inner wall of the apparatus and adhere again to the upper surface of the wafer.

The object of the present invention is to provide an apparatus for etching a wafer by a single-wafer process and a method for etching a wafer by a single-wafer process that prevent etching fluid from passing round towards the undersurface of the wafer as well as preventing re-adhesion of the etching fluid to the upper surface of the wafer and further preventing the localized deformation of the edge portion of the wafer.

SUMMARY OF THE INVENTION

The present invention provides an improved configuration to an apparatus by a single-wafer process for etching a wafer sliced from a silicon ingot by supplying etching fluid on the wafer while horizontally holding and rotating the wafer.

An apparatus for etching a wafer by a single-wafer process according to a first aspect of the invention is constituted to comprise: a wafer-chuck (a device for holding a wafer) which holds a single disk-shaped wafer sliced from a silicon single crystal ingot and rotates the wafer in a horizontal plane; a fluid supplying device which supplies an etching fluid on the wafer; a gas injection device which is disposed at the wafer-chuck and injects a gas to the wafer so as to blow off the etching fluid flowing down over the edge of the wafer in the outward radial direction away from the wafer; a first fluid-aspirating device which is disposed at the wafer-chuck and aspirates the etching fluid blown off from the wafer by the gas injected from the gas injection device; and a second fluid-aspirating device which is placed outside the wafer-chuck and the circumference of the wafer on the wafer-chuck and aspirates the etching fluid blown off from the wafer by the gas injected from the gas injection device and the etching fluid scattered from the wafer by centrifugal force.

In the above-described apparatus for etching a wafer by a single-wafer process, a wafer is firstly mounted on the wafer-chuck such that the wafer maintains a horizontal state. In that state, the wafer is rotated in the horizontal plane, and high-speed gas flow is generated by the gas injection device such that the gas flows at high-speed in the clearance S between the upside of the wafer-chuck and lower face of the wafer.

When etching fluid is supplied to the upper surface of the wafer in the above-described state, by a centrifugal force caused by rotation of the wafer in the horizontal plane, the etching fluid gradually moves from the portion to which the etching fluid is supplied towards the edge portion of the wafer while etching the upper surface of the wafer, and then etches the edge portion of the wafer. By the centrifugal force which accompanies rotation of the wafer, a large part of the etching fluid is scattered outside of the wafer. The scattered etching fluid is aspirated by the second fluid-aspirating device. On the other hand, a part of the etching fluid which tends to pass round the edge of the wafer towards the undersurface of the wafer is blown off in the outward radial direction by the high-speed flow of the gas flowing in the outward radial direction in the clearance between the upside of the wafer-chuck and undersurface of the wafer. The etching fluid blown off from the wafer is aspirated by the first fluid-aspirating device or scattered outside of the wafer and is aspirated by the second fluid-aspirating device.

As a second aspect of the invention, in the above-described apparatus for etching a wafer by a single-wafer process according to the first aspect of the invention, the gas injection device may comprise: an annular injection nozzle which is provided on the upside of the wafer-chuck along a circumferential direction thereof and faces a near-edge portion of an undersurface of the wafer; an annular injection channel an upper end of which communicates with the injection nozzle, and a diameter of which gradually decreases in the downward direction; and a gas supply unit which communicates with the injection channel and supplies a compressed gas to the injection nozzle through the injection channel.

In the above-described constitution of an apparatus for etching a wafer by a single-wafer process, by activating the gas supply unit of the gas injection device, the compressed gas flows through the injection channel and is injected from the injection nozzle, thereby generating a high-speed gas flow flowing towards the outward radial direction away from the wafer in the clearance between the upside of the wafer-chuck and undersurface of the wafer. As a result, the etching fluid partially flowing down through the edge of the wafer towards the undersurface of the wafer is blown off towards the outer radial direction by the high-speed gas flow, and the etching fluid is aspirated by the first fluid-aspirating device or by being scattered outside of the wafer and is aspirated by the second fluid-aspirating device.

As a third aspect of the invention, in the apparatus for etching a wafer by a single-wafer process according to the first aspect, the first fluid-aspirating device may comprise: an annular aspirating nozzle which is provided on the upside of the wafer-chuck along the circumference of the wafer-chuck to the outer portion with respect to the gas injection device, and faces an edge portion of the wafer or a region from the edge portion of the wafer to an outer region radially distant from the wafer; an annular aspirating channel which is provided at the wafer-chuck, where the upper end of the aspirating channel communicates with the annular aspirating nozzle; and a first fluid-aspirating unit which communicates with the aspirating channel and aspirates an etching fluid flowing in the aspirating channel from the aspirating nozzle.

In the apparatus for etching a wafer by a single-wafer process having a first fluid-aspirating device of the above-described constitution, by activating the first fluid-aspirating unit, the inside of the aspirating channel is maintained at a reduced pressure. Therefore, a part of the etching fluid flowing down over the edge of the wafer towards the undersurface of the wafer is blown off in the outward radial direction away from the wafer by the gas injection device, and then flows through the aspirating nozzle into the aspirating channel maintained at a reduced pressure, and is aspirated by the reduced pressure. The etching fluid scattered to the outer region of the wafer is aspirated by the second fluid-aspirating device.

As a fourth aspect of the invention, in the apparatus for etching a wafer by a single-wafer process according to the above-described first aspect, the second fluid-aspirating device may comprise: a fluid-catching unit which is provided at the outside region of the wafer-chuck and circumference of the wafer with predetermined spacings from the wafer-chuck and the circumference of the wafer, and has an opening facing the wafer-chuck and the circumference of the wafer; and a second fluid-aspirating unit which communicates with the fluid-catching unit and aspirates the etching fluid in the fluid-catching unit.

In the apparatus for etching a wafer by a single-wafer process having the second fluid-aspirating device of the above-described constitution, by activating the second fluid-aspirating of the second fluid-aspirating unit, the inside of the fluid-catching unit is maintained at a reduced pressure. Therefore, when a part of the etching fluid which tends to pass round the edge of the wafer towards the undersurface of the wafer is blown off in the outward radial direction away from the wafer by the gas injection device, the etching fluid is aspirated by the first fluid-aspirating device, or otherwise, the etching fluid is scattered outside of the wafer and is caught by the fluid-catching unit maintained at a reduced pressure and aspirated by the reduced pressure.

As a fifth aspect of the invention, the injection nozzle of the gas injection device having the constitution of the above-described second aspect may be provided with an annular peak protruding so as to narrow the opening of the injection nozzle.

In the apparatus for etching a wafer by a single-wafer process, by activating the gas supply unit of the gas-injection device such that the compressed gas passes through the injection channel and is injected from the injection nozzle, gas flow flowing in the outward radial direction away from the wafer is generated in the clearance between the upper surface of the wafer-chuck and undersurface of the wafer. At that time, since the opening of the injection nozzle is narrowed by the peak, the gas flow is made to be a high speed flow.

As a sixth aspect of the invention, in the above-described apparatus for etching a wafer by single-wafer process according to the first aspect, the wafer-chuck may be provided with an annular guide-rim such that the guide-rim protrudes from the upper portion of the circumferential edge of the wafer-chuck and, in the upward direction, the inner surface of the guide-rim leans towards the outward radial direction with respect to the wafer-chuck.

In the apparatus for etching a wafer by a single-wafer process of this case, when a part of the etching fluid which tends to pass round the edge portion of the wafer towards the undersurface of the wafer is blown off in the outward radial direction away from the wafer by the gas injected from the gas injection device and then scattered outside of the wafer, the scattered etching fluid is turned to the upper oblique direction by the guide-rim. Therefore, the scattered etching fluid is smoothly aspirated by the second fluid-aspirating device.

The present invention provides an improved method for etching a wafer by a single-wafer process in which a wafer sliced from a silicon ingot is placed on the wafer-chuck and is etched by supplying etching fluid on the wafer while horizontally holding and rotating the wafer.

The constitution of the method or etching a wafer by a single-wafer process according to a seventh aspect of the invention may includes: performing etching of a wafer sliced from a silicon single crystal ingot by supplying an etching fluid on the wafer while horizontally holding and rotating the wafer on a wafer-chuck; performing blowing off of the etching fluid such that the etching fluid flowing down over an edge portion of the wafer placed on the wafer-chuck is blown off in the outer radial direction by injection of a gas; and performing aspirating of the etching fluid such that the above-described blown off etching fluid and an etching fluid scattered by the centrifugal force caused by the rotation of the wafer are both aspirated together with gas.

In the above-described method for etching a wafer by a single-wafer process, a wafer is firstly mounted on the wafer-chuck such that the wafer maintains a horizontal state. In that state, while rotating the wafer in the horizontal plane, etching fluid is supplied to the upper surface of the wafer. Then, by a centrifugal force caused by rotation of the wafer in the horizontal plane, the etching fluid gradually moves from the portion to which the etching fluid is supplied towards the edge portion of the wafer while etching the upper surface of the wafer, and then etches the edge portion of the wafer. By the centrifugal force which accompanies rotation of the wafer, a large part of the etching fluid is scattered outside of the wafer, and then is aspirated. On the other hand, a part of the etching fluid which tends to pass round the edge portion of the wafer towards the undersurface of the wafer is blown off in the outward radial direction away from the wafer by injection of a gas.

As explained above, according to the present invention, the etching fluid flowing down over the edge portion of the wafer placed on the wafer-chuck is blown off in the outward radial direction away from the wafer by injection of a gas from the gas injection device, the etching fluid blown off by the gas injection device is aspirated together with a gas by the first fluid-aspirating device, and the etching fluid blown off by the gas injection device or scattered by the centrifugal force is aspirated together with the gas by the second fluid-aspirating unit. Because of such a constitution, most of the etching fluid is scattered outside of the wafer by a centrifugal force which accompanies the rotation of the wafer, and a part of the etching fluid which tends to pass round the edge portion of the wafer towards the undersurface of the wafer is blown off in the outward radial direction away from the wafer by a high speed gas flow generated by the gas injection device. Then, the above-described scattered etching fluid is aspirated by the second fluid-aspirating device, and the above-described blown off etching fluid is aspirated by the first fluid-aspirating device, or otherwise, scattered outside of the wafer and is aspirated by the second fluid-aspirating device. As a result, etching fluid is prevented from passing round towards the undersurface of the wafer. Since the scattered etching fluid does not adhere to the upper surface of the wafer again, the upper surface of the wafer can be homogeneously etched. In addition, since the etching fluid is retained at the edge portion of the wafer only for a short duration, localized deformation of the edge portion can be effectively inhibited.

In addition, if an annular injection nozzle is provided on the upside of the wafer-chuck along the circumferential direction of the wafer-chuck so as to face a near-edge portion of the undersurface of the wafer; an annular injection channel having an upper end communicating with the injection nozzle and a diameter gradually decreasing in the downward direction is provided in the wafer-chuck; and a gas supply device is communicated with the injection channel for supplying compressed gas through the injection channel to the injection nozzle, by activating the gas supply unit of the gas injection device, a high-speed gas flow flowing towards the outward radial direction away from the wafer is generated in the clearance between the upside of the wafer-chuck and undersurface of the wafer.

As a result, the etching fluid partially flowing down over the edge of the wafer towards the undersurface of the wafer is blown off towards the outer radial direction by the high-speed gas flow, and the etching fluid is aspirated by the first fluid-aspirating device or is scattered outside of the wafer and is aspirated by the second fluid-aspirating device.

If an aspirating nozzle facing the edge portion of the wafer or the like is provided in an annular arrangement on the upper side of the wafer-chuck along its circumference at the outer portion with respect to the gas injection device, an annular aspirating channel upper end of which communicates with the annular aspirating nozzle is provided at the wafer-chuck, and a first fluid-aspirating unit for aspirating a etching fluid flowing in the aspirating channel together with a gas communicates with the aspirating channel, by activating the first fluid-aspirating unit, the inside of the aspirating channel is maintained at a reduced pressure. As a result, a part of the etching fluid flowing down over the edge of the wafer towards the undersurface of the wafer is blown off in the outward radial direction away from the wafer by the gas injection device, and then flows through the aspirating nozzle into the aspirating channel maintained at a reduced pressure, and is aspirated by the reduced pressure. Otherwise, the etching fluid scattered to the outer region of the wafer is aspirated by the second fluid-aspirating device.

When a fluid-catching unit having an opening facing the wafer-chuck and the circumference of the wafer is provided at the outside region of the wafer-chuck and circumference of the wafer with predetermined spacings from the wafer-chuck and the circumference of the wafer, and a second fluid-aspirating unit for aspirating the etching fluid in the fluid-catching unit communicates the fluid-catching unit, by activating the second fluid-aspirating unit, the inside of the fluid-catching unit is maintained at a reduced pressure. As a result, since a part of the etching fluid which tends to pass round the edge of the wafer towards the undersurface of the wafer is blown off in the outward radial direction away from the wafer by the gas injection device, the etching fluid is aspirated by the first fluid-aspirating device, or otherwise, the etching fluid is scattered outside of the wafer and is caught by the fluid-catching unit maintained at a reduced pressure and aspirated by the reduced pressure.

When the gas supply unit is activated and the compressed gas passes through the injection channel and is injected from the injection nozzle, by providing the injection nozzle with an annular peak protruding so as to narrow the opening of the injection nozzle, it is possible to enhance a flow rate of gas flow flowing, in the clearance between the upper surface of the wafer-chuck and undersurface of the wafer, in the outward radial direction away from the wafer.

If the wafer-chuck may be provided with an annular guide-rim such that the guide-rim protrudes from the upper portion of the circumferential edge of the wafer-chuck and, in the upward direction, the inner surface of the guide-rim leans towards the outward radial direction away from the wafer, a part of the etching fluid blown off in the outward radial direction away from the wafer by the gas injection device is turned to the upper oblique direction by the guide-rim. Therefore, the scattered etching fluid is smoothly aspirated by the second fluid-aspirating device.

In addition, by blowing off the etching fluid flowing down over the edge portion of the wafer placed on the wafer-chuck by the gas injection device, and by aspirating the etching fluid scattered by a centrifugal force caused by the rotation of the wafer and the above-described blown off etching fluid, the same in the above-described constitution, it is possible to prevent the etching fluid from passing round towards the undersurface of the wafer. In addition, since the scattered etching fluid does not adhere to the upper surface of the wafer again, the upper surface of the wafer can be homogeneously etched. Moreover, since the etching fluid is retained at the edge portion of the wafer only for a short duration, localized deformation of the edge portion can be effectively inhibited.

DETAILED DESCRIPTION OF THE INVENTION

In the following, embodiments of the present invention are explained with reference to the drawings.

First Embodiment

Figure 1:
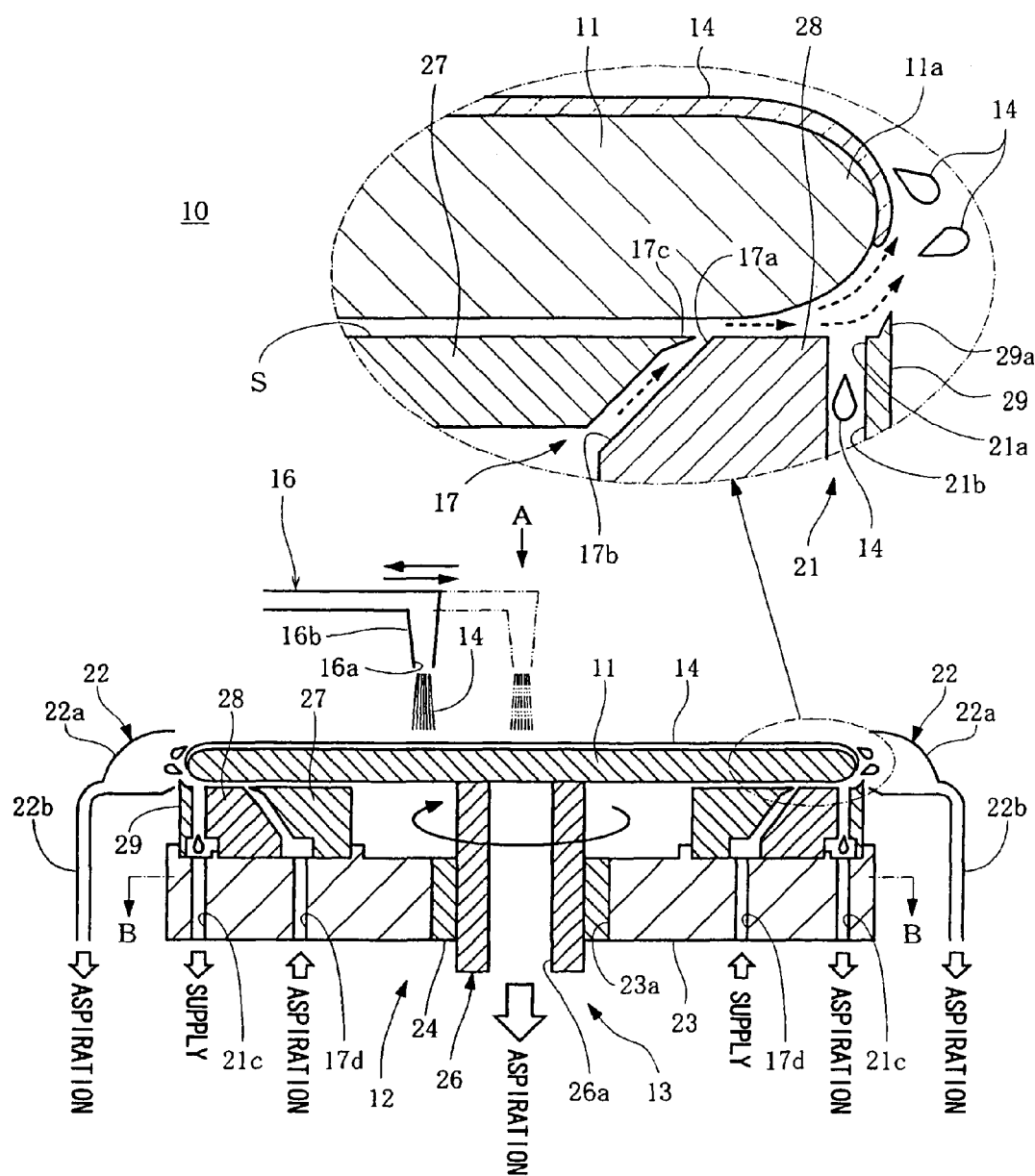
FIG. 1 is a vertical cross section of a main part of an apparatus for etching a wafer by a single-wafer process of an embodiment of the present invention.

As shown in FIG. 1, a single-wafer processing apparatus 10 for etching a single silicon wafer 11 is received in a chamber and comprises: a wafer-chuck 12 which mounts the single silicon wafer 11 having a thin disk shape and horizontally supports the wafer 11; a rotation unit 13 for rotating the wafer about the vertical center axis of the wafer 11; an etching fluid supply device 16 for supplying etching fluid 14 to the upper surface of the wafer 11 mounted on the wafer-chuck; a gas injection device 17 which blows off the etching fluid 14 flowing over an edge portion 11a of the wafer 11 in the outward radial direction away from the wafer 11; a first fluid-aspirating device 21 and a second fluid-aspirating device 22 that aspirate both of the etching fluid 14 scattered by a centrifugal force which accompanies the rotation of the wafer 11, and the etching fluid 14 blown off by the gas injection device 17. The wafer 11 is sliced from a silicon single crystal ingot. A circumference edge of the wafer 11, that is, the edge portion 11a of the wafer 11, is chamfered so as to have a convex shape having a predetermined curvature radius.

Figure 2:
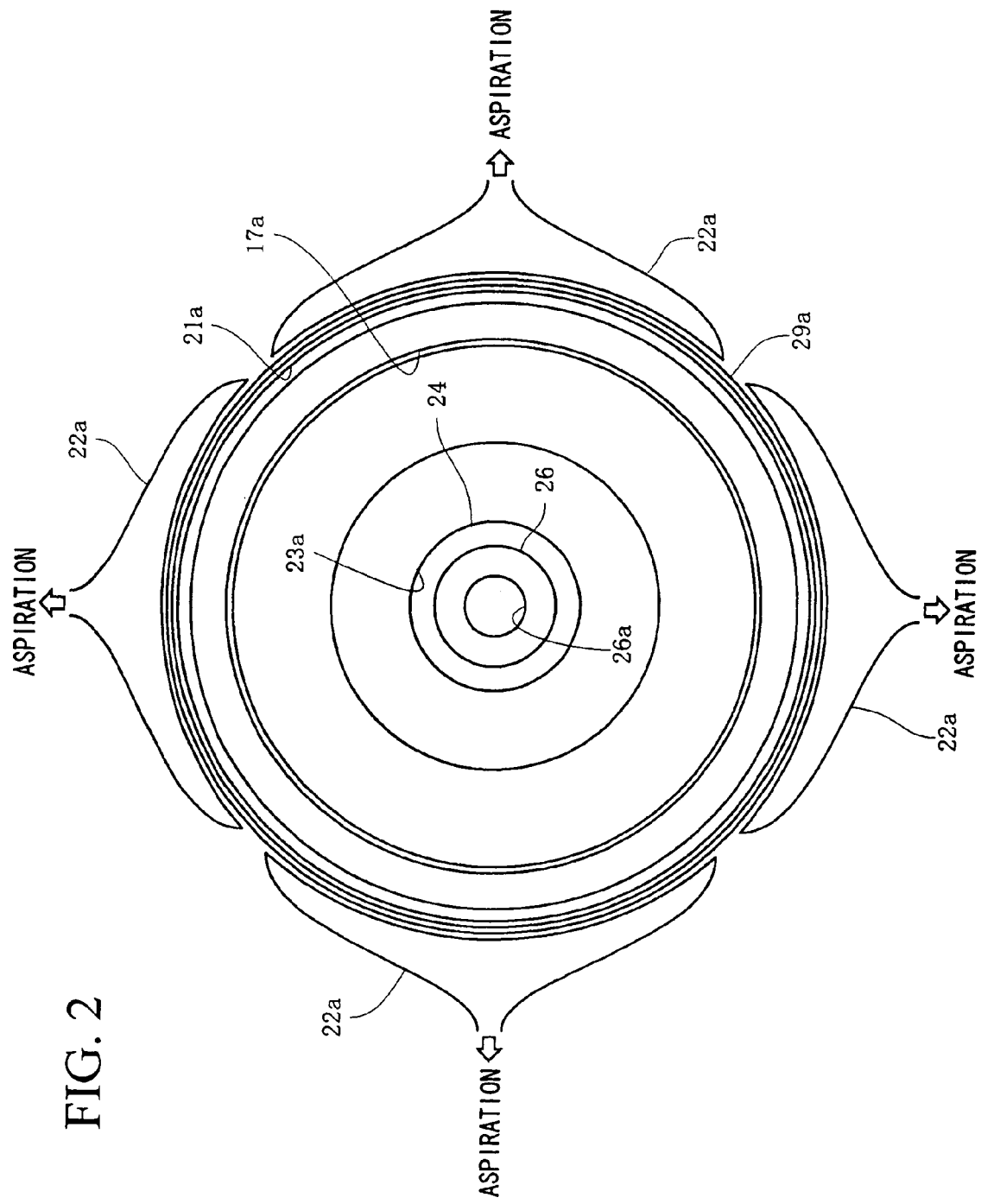
FIG. 2 is an arrow diagram of the apparatus for etching a wafer by a single-wafer process before mounting a wafer. The direction of the arrow is shown by the symbol A in FIG. 1.

As shown in FIGS. 1 and 2, the wafer-chuck 12 comprises: a cylindrical base member 23 which is provided with a larger diameter than that of the wafer 11; a rotatable support shaft 26 which penetrates, via a bearing 24, a aperture 23a vertically elongating in a central portion of the base member 23. A vertically elongating perforation 26a is perforated in the center of the center of the support shaft 26, and the lower end of the perforation 26a communicates with a vacuum pump (not shown). The wafer 11 is concentrically mounted on the upside of the support shaft 26 (FIG. 1). When the vacuum pump of the gas injection device 17 is activated and the interior of the perforation 26a is made to have a reduced pressure, by the reduced pressure of the perforation 26a, the wafer 11 is absorbed and horizontally supported by the wafer 11. The rotation unit 13 has the above-described support shaft 26 and a driving motor (not shown) for rotating the support shaft 26. By rotating the support shaft 26 by the driving motor, the wafer 11 supported by the support shaft 26 is rotated together with the support shaft 26. The etching fluid supply device 16 comprises a nozzle 16b which is provided above the wafer 11 and has an exhaust port 16a facing the upper surface of the wafer 11; a supply pump (not shown) which is connected to the bottom end of the nozzle 16b and supplies the etching fluid 14 to the exhaust port 16a through the nozzle 16b; and a nozzle transport unit (not shown) for transporting the nozzle in the horizontal direction.

Figure 3:
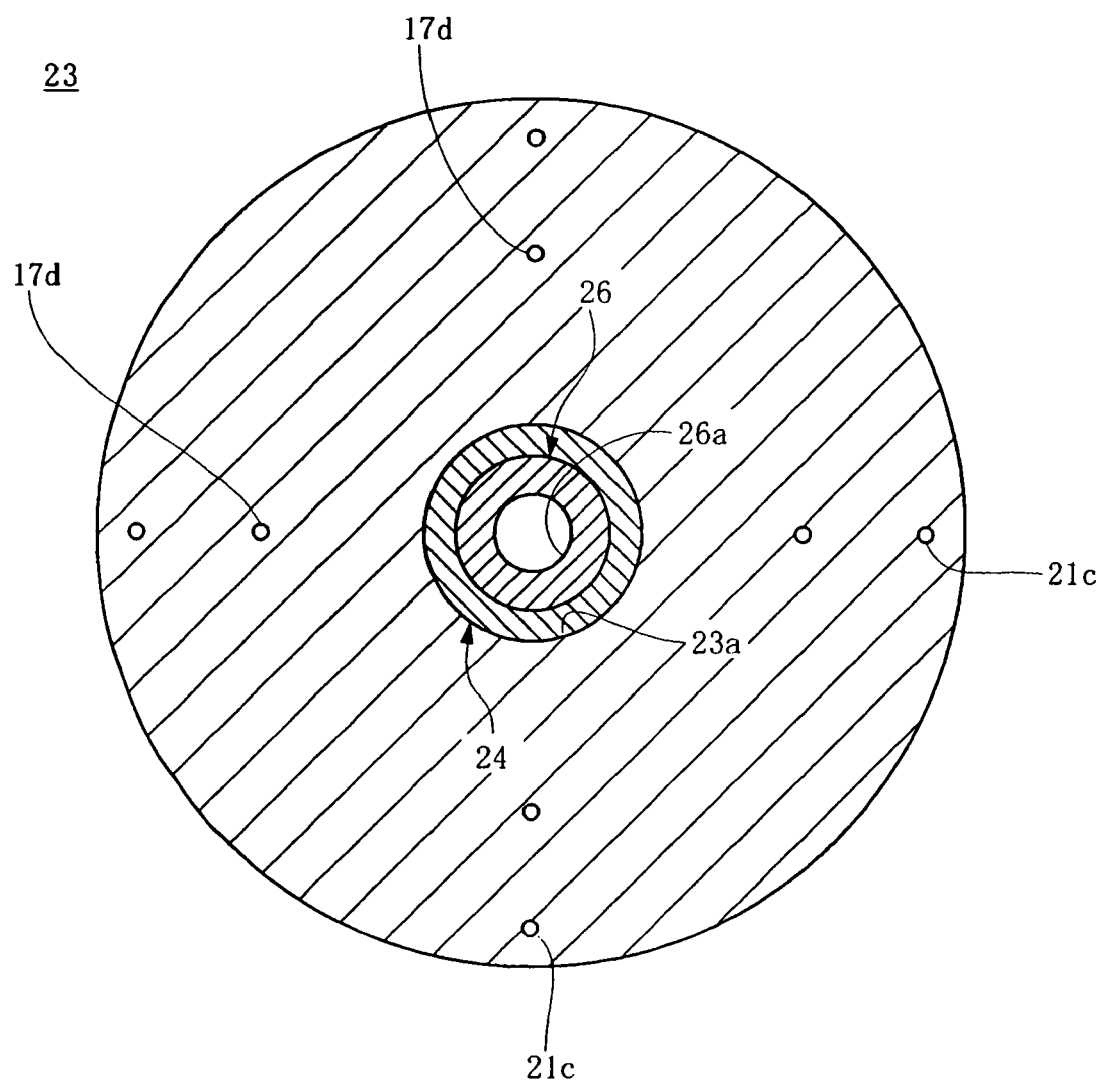
FIG. 3 is a cross section of the apparatus for etching a wafer by the single-wafer process of FIG. 1 along the line of B-B in FIG. 1.

On the other hand, the gas injection device comprises: an annular injection nozzle 17a which is provided on the upside of the wafer-chuck 12 along the circumferential direction of the wafer-chuck 12; an annular injection channel upper end thereof which communicates with the injection nozzle 17a; and a gas supply unit (not shown) which communicates with an injection channel 17b (FIG. 1 and FIG. 2). The gas injection nozzle 17a is formed so as to face a near-edge portion of the undersurface of the wafer and is provided with an annular peak 17c protruding so as to narrow the opening of the injection nozzle. The injection channel 17b is formed such that the diameter thereof gradually decreases in the downward direction (FIG. 1). The lower end of the injection channel 17b communicates with the upper end of four gas supply holes 17d formed in the base member 23 (FIG. 1 and FIG. 3). The gas supply unit has a compressor as a constituent for compressing a gas such as nitrogen gas and air and is connected and communicates with the annular injection channel 17b via the four gas supply holes 17d. A gas compressed by the gas supply unit passes through the gas supply holes 17d and gas injection channel 17b and is supplied to the gas injection nozzle 17a.

The first fluid-aspirating device 21 comprises: an annular aspirating nozzle 21a which is provided, along the circumference of the wafer-chuck 12, at the outer portion with respect to the gas injection nozzle 17a of the gas injection device 17; an annular aspirating channel 21b which is provided at the wafer-chuck 12 and an upper end thereof communicates with the annular aspirating nozzle 21a; and a first fluid-aspirating unit (not shown) which communicates with the aspirating channel 21b (FIG. 1 and FIG. 2). The annular aspirating nozzle 21a is formed on the upper side of the wafer-chuck so as to face the edge portion 11a of the wafer 11. The aspirating channel 21b is formed so as to have a vertically elongating cylindrical shape (FIG. 1), and the lower end of the aspiration channel 21b communicates with four fluid-aspirating holes 21c formed in the base member (FIGS. 1 and 3). The first fluid-aspirating unit 21 has constituents such as a vacuum pump and communicates with the annular aspiration channel 21b via the four fluid-aspirating holes. The etching fluid 14 flows through the aspirating nozzle 21a and the aspirating channel 21b into the aspirating holes 21c and is aspirated together with the gas by the first fluid-aspirating device 21.

While the aspirating nozzle of the above-described embodiment is formed on the upper side of the wafer-chuck so as to face the edge portion of the wafer, the aspirating nozzle may be formed on the upper side of the wafer-chuck so as to face the outer radial region with respect to the wafer. In addition, although four gas supply holes and four fluid aspirating holes are formed on the base member of the above-described embodiment, the number of gas supply holes, and fluid aspirating holes may be selected from two, three, or five and more.

The above-described injection channel 17b and the aspiration channel 21b may be formed by a cone member 27, tapered member 28, and a cylindrical member 29 that are concentrically arranged with the base member 23 and attached to the upper side of the base member 23 (FIG. 1). The cone member 27, tapered member 28, the cylindrical member 29, and the base member 27 are constituent members of the wafer-chuck 12. A circumferential face of the cone member is formed so as to have a cone shape such that the diameter of the circumference decreases towards the lower portion. An inner circumferential face of the tapered member is formed so as to have a tapered shape such that the diameter of the inner circumference decreases towards the lower portion. After attaching the tapered member 28 to the base member 23, the cone member is attached to the base member 23, thereby forming an annular clearance S between the circumferential face of the cone member 27 and inner circumferential face of the tapered member 28. The annular clearance serves as the injection channel 17b. The annular peak 17c for narrowing the opening of the injection nozzle 17a is formed by providing the entire perimeter of the upper end of the cone member 27 with a projection which is tapered towards the outward direction. By attaching the cylindrical member 29 to the base member 23, the annular clearance which serves as the aspiration channel 21b is formed between the circumferential face of the tapered member 28 and the inner circumferential face of the cylindrical member 29. In addition, the upper portion of the circumferential face of the cylindrical member 29 is provided with an annular guide-rim 29a protruding such that, in the upward direction, the inner surface of the guide-rim 29a leans towards the outward radial direction away from the wafer-chuck 12.

When the wafer 11 is mounted on the support shaft 23, the clearance S is formed between the under surface of the wafer 11 or its extension and the top surface of the cone member 27, tapered member 28, and the cylindrical member 29. A width of the clearance is set to be 0.1 to 2 mm, preferably 0.2 to 1 mm. In the horizontal direction, the width of the injection channel 17b is set to be 0.1 to 2 mm, preferably 0.2 to 1 mm. The inner circumferential face of the guide-rim 29a has an inclination of 15 to 120 degrees, preferably 30 to 60 degrees subtending the horizontal plane. Height of the guide-rim 29a is set to be 0.1 to 3 mm, preferably 0.5 to 1.5 mm. When the width of the clearance S between the undersurface of the wafer or the like and the top surface of the cone member or the like is less than 0.1 mm, because of vibration of the shaft or the like during the rotation of the wafer 11, there is a possibility of the wafer 11 touching the constituents of the wafer-chuck such as the cone member 27 and the tapered member 28. On the other hand, when the width of the clearance S exceeds 2 mm, functions of the gas injection device 17 and the first fluid-aspirating device degrade. Therefore, the width of the clearance was limited to be in a range of 0.1 to 2 mm. When the width of the injection channel 17b is less than 0.1 mm in the horizontal direction, it is difficult to supply the gas. On the other hand, when the width of the injection channel 17b exceeds 2 mm in the horizontal direction, supply flow rate of the gas is insufficient. Therefore, in the horizontal direction, the width of the injection channel 17b is limited to be in a range of 0.1 to 2 mm. When the width of the injection nozzle 17a is less than 0.1 mm in the horizontal direction, it is difficult to inject the gas. On the other hand, when the width of the injection nozzle 17a exceeds 2 mm in the horizontal direction, supply flow rate of the gas is insufficient. Therefore, in the horizontal direction, the width of the injection nozzle 17a is limited to be in a range of 0.1 to 2 mm.

When the inclination of the inner circumferential face of the guide-rim 29a is less than 15 degrees subtending the horizontal plane, it is difficult to sufficiently prevent the etching fluid from passing round towards the undersurface of the wafer 11. When the inclination exceeds 120 degrees, reverse flow of the gas or scattering of the gas towards the edge portion 11a of the wafer 11 are caused to occur. Therefore, the inclination is set to be in a range of 15 to 120 degrees. When the height of the guide-rim is less than 0.1 mm, effect of inhibiting the injection flow of the gas is degraded. When the height exceeds 2 mm, the etching fluid 14 scattered by the centrifugal force in the outward direction collides and bounces off the inclined surface of the guide-rim towards the edge portion 11a of the wafer 11. Therefore, the height of the guide-rim 29a is limited to be in a range of 0.1 to 2 mm.

On the other hand, the second fluid-aspirating device 22 comprises: a fluid-catching unit 22a which is provided at the outside region of the wafer-chuck 12 and circumferential face of the wafer 11 with predetermined spacings from the wafer-chuck 12 and the circumference of the wafer 11; and a second fluid-aspirating unit (not shown) which communicates with the fluid-catching unit 22a (FIG. 1 and FIG. 2).

The fluid-catching unit 22a has an opening facing the wafer-chuck 12 and the circumferential face of the wafer 11. In plan view, the opening is formed to be an arc shape subtending the central angle of about 90 degrees. By arranging four fluid-catching units 22a at the outside region of the wafer-chuck 12 and circumferential face of the wafer 11, the fluid catching units 22a are configured so as to surround the entire periphery of the wafer-chuck 12 and the wafer 11 (FIG. 1 and FIG. 2). Bottom ends of aspirating pipes 22b are respectively connected and communicate with the fluid-catching units 22a. The second fluid-aspirating unit having a vacuum pump as a constituent communicates with the four fluid-catching units 22a via the four aspirating pipes 22b. Through the aspirating pipes 22b, the etching fluid 14 in the fluid-catching unit 22a is aspirated together with the gas by the second fluid-aspirating unit. A shape of the inner face of the fluid-catching unit 22a is formed to have angles such that the etching fluid 14 is prevented from adhering to the upper surface of the wafer 11 even when the etching fluid 14 bounces off the inner face of the fluid-catching unit. In the above-described embodiment, four fluid catching units were provided at the outside region of the wafer-chuck 12 and circumferential face of the wafer 11. However it should be noted that the number of fluid catching units may be selected from one, two, three, or five and more provided that almost the entire periphery of the wafer-chuck 12 and the wafer 11 are surrounded by the fluid-catching units. In addition, a plurality of aspirating pipes may be connected to each of the fluid-catching units.

Operation of the apparatus 10 having the above-described constitution for etching a wafer 11 by single-wafer process is explained as follows.

Firstly, at a state in which the wafer 11 is placed in the wafer-chuck 12, a vacuum pump that communicates with the bottom end of the perforation 26a of the support shaft 26 is activated so as to keep the inside of the perforation 23a at a reduced pressure. By this reduced pressure, the wafer 11 is supported horizontally. In that state, a driving motor of the rotation unit is activated so as to rotate the wafer 11 together with the support shaft 26 in the horizontal plane. Next, a gas supply unit of the gas injection device 17 is activated and a compressed gas composed of nitrogen gas or air is supplied through the gas supply holes 17d and injection channel 17b to the injection nozzle 17a and is injected from the injection nozzle 17a, thereby forming a gas flow flowing in the outer radial direction of the wafer 11 in the clearance S between the top surface of the wafer-chuck 12 and undersurface of the wafer 11, that is, the clearance S between the undersurface of the wafer 11 and the top faces of the cone member 27, tapered member 28 and the cylindrical member 29. Since the opening of the injection nozzle 17a is narrowed by the peak, the above-described gas flow is made to be a high speed flow. By activating the first fluid-aspirating unit of the first fluid-aspirating device 21, insides of the fluid-aspirating holes 21c and fluid-aspirating channel 21b are maintained at a reduced pressure. By activating the second fluid-aspirating unit of the second fluid-aspirating device 22, insides of the fluid aspirating pipe 22b and the fluid-catching unit 22a are maintained at a reduced pressure. Next, by activating the supply pump of the etching fluid supply unit 16 and the nozzle transport unit, while horizontally transporting the exhausting nozzle 16b, the etching fluid 14 is supplied from the exhausting port 16a to the upper surface of the wafer 11.

By the centrifugal force caused by the rotation of the wafer 11 in the horizontal plane, the etching fluid 14 supplied on the surface of the wafer 11 gradually moves from the portion to which the etching fluid is supplied towards the edge portion 11a of the wafer while etching the upper surface of the wafer, and then etches the edge portion 11a of the wafer. By the centrifugal force which accompanies rotation of the wafer, a large part of the etching fluid 14 on wafer 11 is scattered outside of the wafer 11 in the form of droplets. The scattered etching fluid is caught by the fluid-catching unit 22a maintained at a reduced pressure. By this reduced pressure, the etching fluid 14 is exhausted from the chamber through the aspirating pipes 22b. On the other hand, a part of the etching fluid 14 tending to flow down over the edge portion 11a of the wafer 11 towards the undersurface of the wafer is blown off in the outer radial direction by the high-speed flow of the gas flowing in the outer radial direction in the clearance between the upside of the wafer-chuck 12 and undersurface of the wafer 11. The etching fluid 14 blown off from the wafer 11 flows into the aspirating channel 21b through the aspirating nozzle 21a, or otherwise, is scattered outside of the wafer 11. By the reduced pressure in the inside of the aspirating channel 21b, the etching fluid 14 flowing in the aspirating channel 21b is exhausted from the chamber.

In addition, since the scattered etching fluid 14 is turned to the upper oblique direction by the guide-rim 29, the etching fluid smoothly enters the fluid-catching unit 22a maintained at a reduced pressure. By this reduced pressure, the etching fluid 14 is exhausted from the chamber through the aspirating pipe 22b. As a result, it is possible to prevent the etching fluid 14 from passing round towards the undersurface of the wafer 11. In addition, since the scattered etching fluid 14 is not adhered to the upper surface of the wafer 11 again, it is possible to etch the upper surface of the wafer 11 homogeneously. In addition, since the etching fluid 14 is retained at the edge portion 11a of the wafer 11 only for a short duration, localized deformation of the edge portion 11a is effectively inhibited.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for etching a wafer by a single-wafer process, comprising:
   performing etching of a wafer sliced from a silicon single crystal ingot by supplying an etching fluid on the wafer while horizontally holding and rotating the wafer on a wafer-chuck;
   blowing off the etching fluid flowing down over an edge portion of the wafer placed on the wafer-chuck in the outward radial direction away from the wafer and scattering the etching fluid in an upper oblique direction by injection of a gas and by guiding the etching fluid utilizing an annular guide rim that protrudes from an upper portion of a circumferential edge of the wafer-chuck; and
   performing aspirating of the etching fluid such that the etching fluid blown off and scattered by the gas and an etching fluid scattered by the centrifugal force caused by the rotation of the wafer are both aspirated together with the gas.

2. A method for etching a wafer according to claim 1, wherein the gas is nitrogen gas or air.

3. A method for etching a wafer according to claim 1, wherein the etching fluid is supplied from a nozzle while horizontally transporting the nozzle during the etching of the wafer.

4. A method for etching a wafer according to claim 1, further comprising aspirating the etching fluid from a position beneath the wafer.

* * * * *